United States Patent
Sun et al.

(10) Patent No.: US 9,476,931 B2
(45) Date of Patent: Oct. 25, 2016

(54) METHOD FOR FAULT LOCATION ANALYSIS OF UNGROUNDED DISTRIBUTION SYSTEMS

(71) Applicant: Mitsubishi Electric Research Laboratories, Inc., Cambridge, MA (US)

(72) Inventors: Hongbo Sun, Plymouth, MN (US); Zhenyu Tan, Atlanta, GA (US)

(73) Assignee: MITSUBISHI ELECTRIC RESEARCH LABORATORIES, INC., Cambridge, MA (US)

( * ) Notice: Subject to any disclaimer, the term of this patent is extended or adjusted under 35 U.S.C. 154(b) by 450 days.

(21) Appl. No.: 14/175,038

(22) Filed: Feb. 7, 2014

(65) Prior Publication Data
US 2015/0226781 A1 Aug. 13, 2015

(51) Int. Cl.
*G06F 11/00* (2006.01)
*G01R 31/08* (2006.01)
(52) U.S. Cl.
CPC ............ *G01R 31/088* (2013.01); *G01R 31/086* (2013.01); *Y04S 10/522* (2013.01)

(58) Field of Classification Search
CPC .. G01R 29/18; G01R 31/023; G01R 31/024; G01R 31/08
USPC ........................ 702/59, 64–66, 182–185, 188
See application file for complete search history.

(56) References Cited

U.S. PATENT DOCUMENTS

| | | | |
|---|---|---|---|
| 5,682,100 A | 10/1997 | Rossi et al. | |
| 5,726,574 A | * 3/1998 | Silverberg | ........... G01R 31/083 324/133 |
| 5,773,980 A | 6/1998 | Yang et al. | |
| 6,483,435 B2 | 11/2002 | Saha et al. | |
| 8,346,207 B2 | 1/2013 | Stewart et al. | |

* cited by examiner

*Primary Examiner* — Edward Raymond
(74) *Attorney, Agent, or Firm* — Gene Vinokur; James McAleenan; Hironori Tsukamoto

(57) ABSTRACT

A location of a fault in an ungrounded power distribution system is determined by identifying a faulty feeder section and a type of the fault using voltages and currents measured before and after the fault and selecting the location of the fault at the faulty feeder section by testing a relationship of a current over a voltage measured at boundaries of the faulty feeder section after the fault with different equivalent admittance matrices of the faulty feeder section determined for different candidate locations of the fault of the determined type. The fault is a short-circuit fault including one or combination of a single-phase-to-ground fault, a phase-to-phase fault, a double-phase-to-ground fault, a three-phase-to-ground fault, and a phase-to-phase-to-phase fault.

15 Claims, 14 Drawing Sheets

METHOD FOR FAULT LOCATION ANALYSIS OF UNGROUNDED DISTRIBUTION SYSTEMS

FIELD OF THE INVENTION

The present invention relates generally to power distribution systems, and more particularly to fault location analysis of an ungrounded power distribution system.

BACKGROUND OF THE INVENTION

Power distribution systems can be susceptible to faults. The faults need to be corrected as soon as possible to reduce power outage time and avoid equipment damage. The correction of faults requires an accurate and fast estimation of locations of the faults.

Several methods have been used for locating multi-phase faults in distribution systems. For example, U.S. Pat. No. 5,682,100 describes traveling wave methods for estimating the fault location. Receiver stations are installed along the power distribution system at locations for sensing and recording time intervals between each transient fault pulse. The fault location is determined based on these time intervals, known time delays and the known propagation velocity of the current in the electric power cables in the power distribution system.

The method described in U.S. Pat. No. 8,346,207 uses a similar approach. Multiple radio transceivers are installed at several locations along the distribution feeder and the fault location is determined by comparing the time of arrival of the signals. However both methods require installation of additional fault measurement devices in the power distribution system, which increase cost.

Another method described in U.S. Pat. No. 5,773,980 describes an impedance-based fault location method for multi-phase faults in power distribution networks. That method calculates a fault impedance by correcting errors due to the interaction of fault resistance and load current. However, the method uses an approximate line model for distribution lines.

The method described in U.S. Pat. No. 6,483,435 calculates fault loop impedance to determine the fault location in an event of multi-phase faults. The method uses sequence components of line for fault location thus approximating the distribution line model and allowing approximation errors in the fault location. Also, the method assumes that the fault is resistive and does not include effects of the fault impedance.

Accordingly, there is a need for locating multi-phase faults in the power distribution systems.

SUMMARY OF THE INVENTION

One object of some embodiments of the invention is to provide a generic fault location analysis method suitable for real-time applications in ungrounded distribution systems. Another object is to provide a method capable of locating various fault types, including single-phase-to-ground, phase-to-phase, double-phase-to-ground, three-phase-to-ground, and phase-to-phase-to-phase faults. Another object is to provide such a method for analyzing bolted faults, and faults with impedances.

Some embodiments of the invention exploit the equivalent admittance matrix at the measuring ports of at least part of the power distribution system to determine the location of the fault. In quantitative terms, the equivalent admittance matrix represents the relationship between the injected currents and terminal voltages at the boundaries of an electrical circuit networks. This relationship is maintained before and after the fault into various sections of the power distribution system, i.e., the fault changes not only at least one of the voltages and the current, but also the equivalent admittance matrix.

The voltages and the currents are measured before and after the fault by various sensors of the power distribution systems. In contrast, the equivalent admittance matrix is generally unknown and depends on the type and the location of the fault. If the location of the fault and the type of the fault is known, the equivalent admittance matrix can be determined, and such determined equivalent admittance matrix would satisfy the relationship between the currents and voltages measured after the fault.

Some embodiments are based on a realization that such relationship can be reversed. Specifically, if the equivalent admittance matrix determined under an assumption that the fault of a specific type occurred at some point of the power distribution system satisfies the relationship between the currents and the voltages measured after the fault, then the location of that point is the location of the fault. Accordingly, if the equivalent admittance matrices are determined for all points of the power distribution systems, i.e., candidate locations of the fault, and for all types of the faults, then the location and the type of the fault can be determined as the location and the type corresponding to the equivalent admittance matrix satisfying the relationship between currents and voltages. However, such extensive computations are usually impractical for the modern power distribution systems.

Some embodiment of the invention are based on another realization that the type of the fault can be predetermined, e.g., by comparing voltages and currents measured at a root of a feeder before and during the fault. In addition, the location of the fault can be localized to a section of the feeder, such that only one type of the fault and only the location of the fault within that section needed to be tested to determine actual location of the fault.

Accordingly, one embodiment of the invention discloses a method for determining a location of a fault in an ungrounded power distribution system including a set of feeders connected to a substation, wherein each feeder includes a set of feeder sections, wherein each feeder section starts with an upstream switch and includes a set of loads connected by line segments and each line segment includes an upstream bus and a downstream bus, and the fault is a short-circuit fault including one or combination of a single-phase-to-ground fault, a phase-to-phase fault, a double-phase-to-ground fault, a three-phase-to-ground fault, and a phase-to-phase-to-phase fault.

The method includes determining a type of the fault by comparing voltages and currents measured at a feeder breaker at a root of a feeder before and during the fault; determining, if the fault is the single-phase fault, a furthest feeder section of the feeder with an angle difference between a residual voltage and a residual current at the upstream switch close to 90 degrees as a faulty feeder section; determining, if the fault is not the single-phase fault, a furthest feeder section of the feeder with an over-current at the upstream switch as the faulty feeder section; determining an equivalent admittance matrix for boundaries of the faulty feeder section having the fault of the determined type at a candidate location; and selecting the candidate location as the location of the fault if the equivalent admittance matrix substantially satisfies the relationship of a current over a voltage measured at the boundaries of the faulty feeder section. The steps of the method are performed by a processor.

Another embodiment discloses a system for determining a location of a fault in an ungrounded power distribution system including a set of feeders connected to a substation, wherein each feeder includes a set of loads connected to line segments and each line segment includes an upstream bus and a downstream bus, and the fault is a short-circuit fault including one or combination of a single-phase-to-ground fault, a phase-to-phase fault, a double-phase-to-ground fault, a three-phase-to-ground fault, and a phase-to-phase-to-phase fault, comprising a processor for determining a faulty feeder section and a type of the fault based on voltages and currents measured before and after the fault; and selecting the location of the fault at the faulty feeder section by testing a relationship of a current over a voltage measured at boundaries of the faulty feeder section after the fault with different equivalent admittance matrices of the faulty feeder section determined for different candidate locations of the fault of the determined type.

DETAILED DESCRIPTION OF THE PREFERRED EMBODIMENT

Ungrounded Distribution Systems and Fault Locating Analysis Methodology

Figure 1:
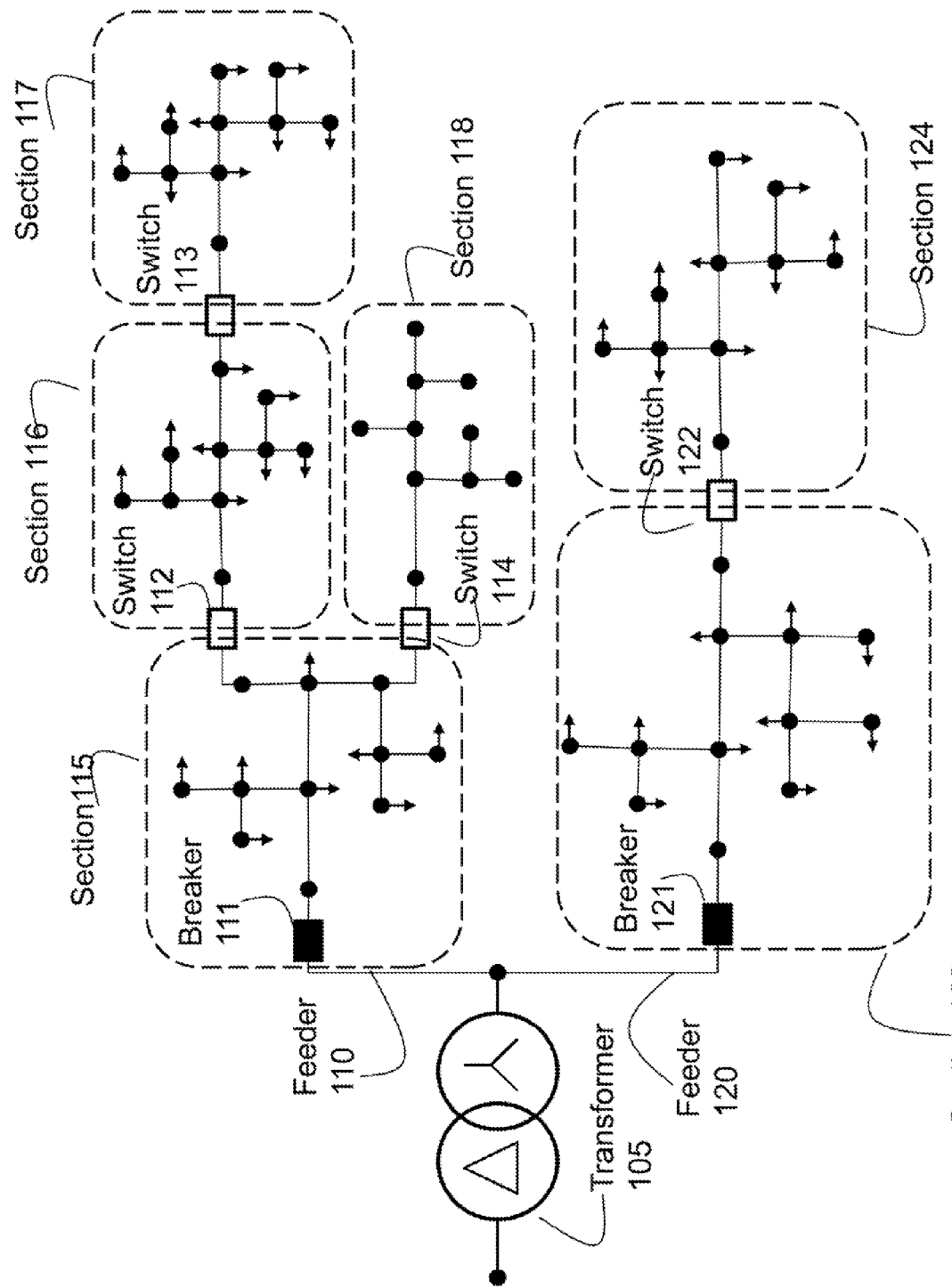
FIG. 1 is a schematic of an exemplar ungrounded distribution system in which embodiments of the invention operate.

FIG. 1 shows an example of an ungrounded distribution system. A distribution system includes a distribution substation in which a three-phase transformer 105 receives electric power from power transmission systems, and provides the power to downstream feeders. The windings of the transformer 105 are ungrounded and can use WYE or DELTA connections. For example, in FIG. 1, the primary winding of the transformer uses the DELTA connection, and secondary winding uses WYE connection. The feeder transfers powers to the loads through three-phase three-wire lines. All loads can be DELTA connected. The distribution systems operate in a radial configuration.

Each feeder can have several switches equipped with sensor units that can provide synchronized three-phase voltage and three-phase current measurements.

In the example of FIG. 1, the transformer 105 is connected to two feeders, a feeder 110, and a feeder 120. Each feeder can include one circuit breaker at its root, e.g., breakers 111, and 121. The feeders can also include switches defining sections of the feeders. For example, the feeder 110 includes switches 112, 113, and 114. The feeder 120 includes one switch 122.

According to the location of the switches, a feeder can be partitioned into several feeder sections. Each feeder section can have multiple measuring devices at its boundaries. All line segments or devices between the measuring devices are part of the feeder section.

For example, the feeder 110 can be partitioned into four feeder sections, section 115, section 116, section 117 and section 118. The feeder section 115 includes all the line segments or devices between breaker 111, switch 112, and switch 114, and include one upstream measuring device located at breaker 111, and two downstream measuring devices located at switch 112, and switch 114. The section 116 is defined by all the line segments or devices between switch 112, and switch 113, and includes one upstream measuring device located at switch 112, and one downstream measuring device located at switch 113. The feeder section 117 is defined as all line segments or devices downstream to switch 113, and includes one upstream measuring device located at switch 113. The feeder section 118 is defined as all line segments or devices downstream to switch 114, and includes one upstream measuring device located at switch 114. The feeder section 115 has three measuring devices and the feeder section 16 has two measuring devices. The feeder sections 117 and 118 have only one measuring device.

The feeder 120 can be partitioned into two feeder sections, section 123, and section 124. The feeder section 123 has one upstream measuring device located at breaker 121, and one downstream measuring device located at switch 122. The feeder section 124 has one upstream measuring device located at switch 122.

A feeder section can be called a one-port section, a two-port section, or a multi-port section when there are one, two or multiple measuring devices located at its boundaries, respectively.

One object of some embodiments of the invention is to provide a generic fault location analysis method suitable for real-time applications in ungrounded power distribution systems. Another object is to provide the method capable of locating various fault types, including single-phase-to-ground, phase-to-phase, double-phase-to-ground, three-phase-to-ground, and phase-to-phase-to-phase faults. Another object is to provide such a method for analyzing both bolted faults, and faults with impedances.

Some embodiments of the invention exploit the equivalent admittance matrix at the measuring ports of at least part of the power distribution system to determine the location of the fault. In quantitative terms, the equivalent admittance matrix represents the relationship between the injected currents and terminal voltages at the boundaries of an electrical circuit networks. This relationship is maintained before and after the fault into various sections of the power distribution system, i.e., the fault changes not only at least one of the voltages and the current, but also the equivalent admittance matrix.

The voltages and the currents are measured before and after the fault by various sensors of the power distribution systems. In contrast, the equivalent admittance matrix is generally unknown and depends on the type and the location of the fault. If the location of the fault and the type of the fault is known, the equivalent admittance matrix can be determined, and such determined equivalent admittance matrix would satisfy the relationship between the currents and voltages measured after the fault.

Some embodiments are based on a realization that such relationship can be reversed. Specifically, if the equivalent admittance matrix determined under an assumption that the fault of a specific type occurred at some point of the power distribution system satisfies the relationship between the currents and the voltages measured after the fault, then the location of that point is the location of the fault. Accordingly, if the equivalent admittance matrices are determined for all points of the power distribution systems, i.e., candidate locations of the fault, and for all types of the faults, then the location and the type of the fault can be determined as the location and the type corresponding to the equivalent admittance matrix satisfying the relationship between currents and voltages. However, such extensive computations are usually impractical for the modern power distribution systems.

Some embodiment of the invention are based on another realization that the type of the fault can be predetermined, e.g., by comparing voltages and currents measured at a root of a feeder before and during the fault. In addition, the location of the fault can be localized to a section of the feeder, such that only one type of the fault and only the location of the fault within that section needed to be tested to determine actual location of the fault.

Figure 2A:
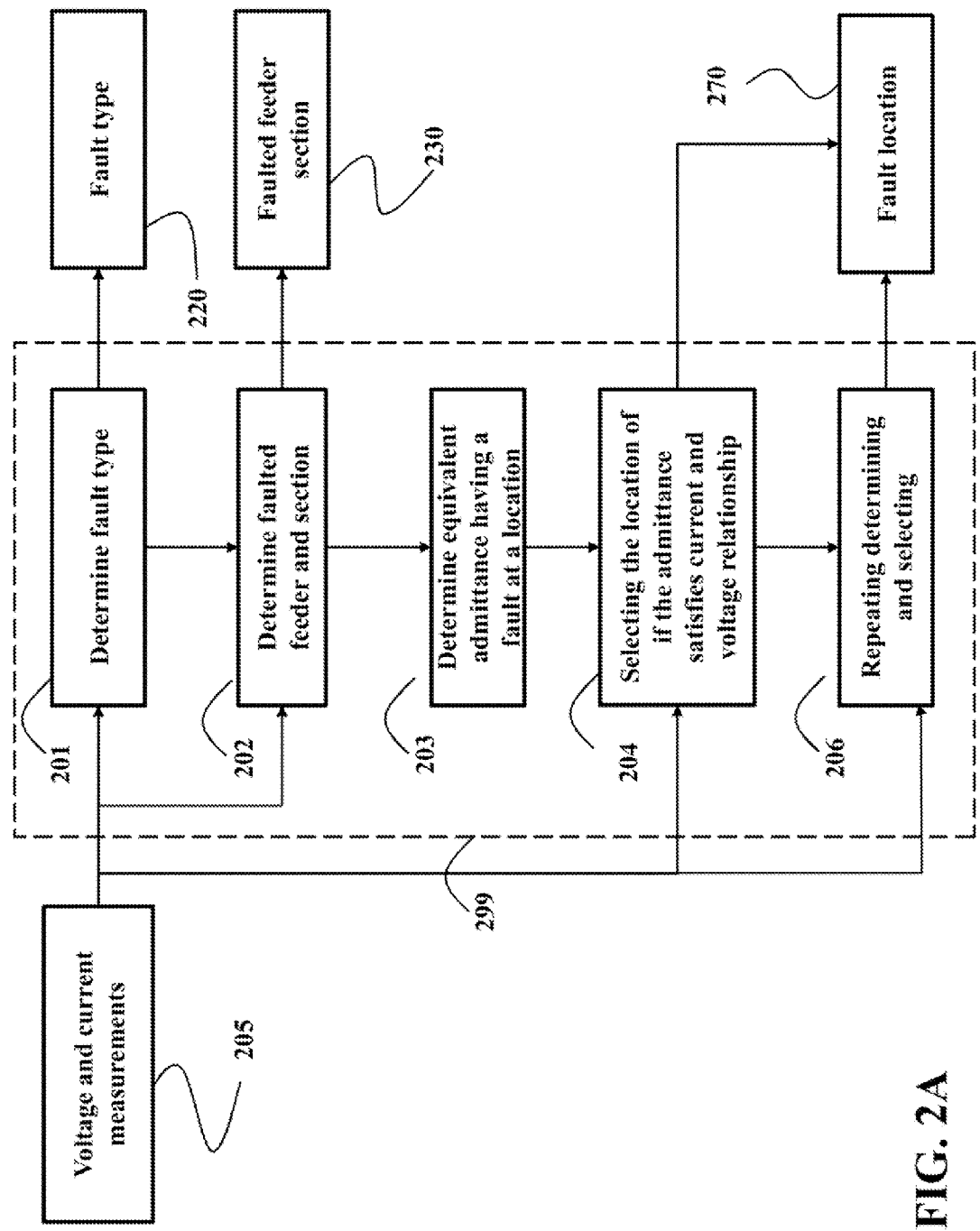
FIG. 2A and FIG. 2B are block diagrams of methods for fault location analysis of ungrounded systems according to some embodiments of invention.

FIG. 2A shows a block diagram of a method for determining a location of a fault in an ungrounded power distribution system according to one embodiment of the invention. The fault is one of a single-phase-to-ground fault, phase-to-phase fault, double-phase-to-ground fault, three-phase-to-ground fault, and phase-to-phase-to-phase fault. The power distribution system includes a set of feeders connected to a substation, wherein each feeder includes a set of feeder sections, wherein each feeder section starts with an upstream switch and includes a set of loads connected by line segments and each line segment includes an upstream bus and a downstream bus. The method can be implemented by a processor 299 using measurement taken by various sensors on the power distribution system The embodiment determines 201 a type of the fault 220 by comparing a voltage and a current 205 measured at a root of a feeder before and during the fault, and determines 202 a faulty feeder section 230 as a furthest feeder section of the feeder with an angle difference between residual voltage and residual current at an upstream switch close to 90 degrees as a faulty feeder section when the fault is a single-phase fault, and a furthest feeder section of the feeder with a current at an upstream switch above a threshold as a faulty feeder section when the fault is a non-single phase fault. As used herein, the angle difference is close to 90 degrees if a mismatch between the angle difference and 90 degrees is less than predetermined threshold, e.g., 10 degrees.

For example, the faulty feeder section is determined 230 as a furthest feeder section with a current at an upstream switch above a threshold for a more than one phase fault. For example, if the fault is in the section 117 of the feeder 110, the upstream switch 113 of the section 117 and the upstream switch 112 of the section 116 would be over-current, i.e., the measurements of the current on those switches are unusually high due to the fault. However, because the section 117 is further from the beginning of the feeder 110 than the section 116, the section 117 is selected as the faulty feeder section.

Next, the embodiment determines 203 an equivalent admittance matrix of the faulty feeder section having the fault of the type of the fault at a location of a point, i.e., a candidate location, at the faulty feeder section. The embodiment selects 204 the candidate location as the location of the fault 270 if the equivalent admittance matrix substantially satisfies the relationship between a current and a voltage measured at boundaries of the faulty feeder section. Otherwise, the embodiment selects another candidate location on the faulty feeder section and repeats 206 steps of the determination of the equivalent admittance matrix and selection of the location of the fault.

In various embodiments, the equivalent admittance matrix substantially satisfies the relationship between the current and the voltage measured at boundaries of the faulty feeder section if the current estimated using the equivalent admittance matrix multiplied by the measured voltage is substantially equals the measured current, e.g., a difference between the estimated current and the measured current is less than a threshold.

Additionally or alternatively, some embodiments determine a set of equivalent admittance matrices of the faulty feeder section corresponding to different candidate location s of the fault at the faulty feeder section and estimate a current for each equivalent admittance matrix in the set of equivalent admittance matrices to produce a set of estimated currents, e.g., by multiplying the measured voltage with the corresponding equivalent admittance matrix. The embodiments select the candidate location corresponding to a minimal difference between the estimated current from the set of estimated currents and the measured current as the location of the fault. As used herein, the equivalent admittance matrix corresponding to a minimal current mismatch between the current estimated using the equivalent admittance matrix and the measured current is the equivalent admittance matrix corresponding to the most correct relationship between the measured voltage and the measured current.

Figure 2B:
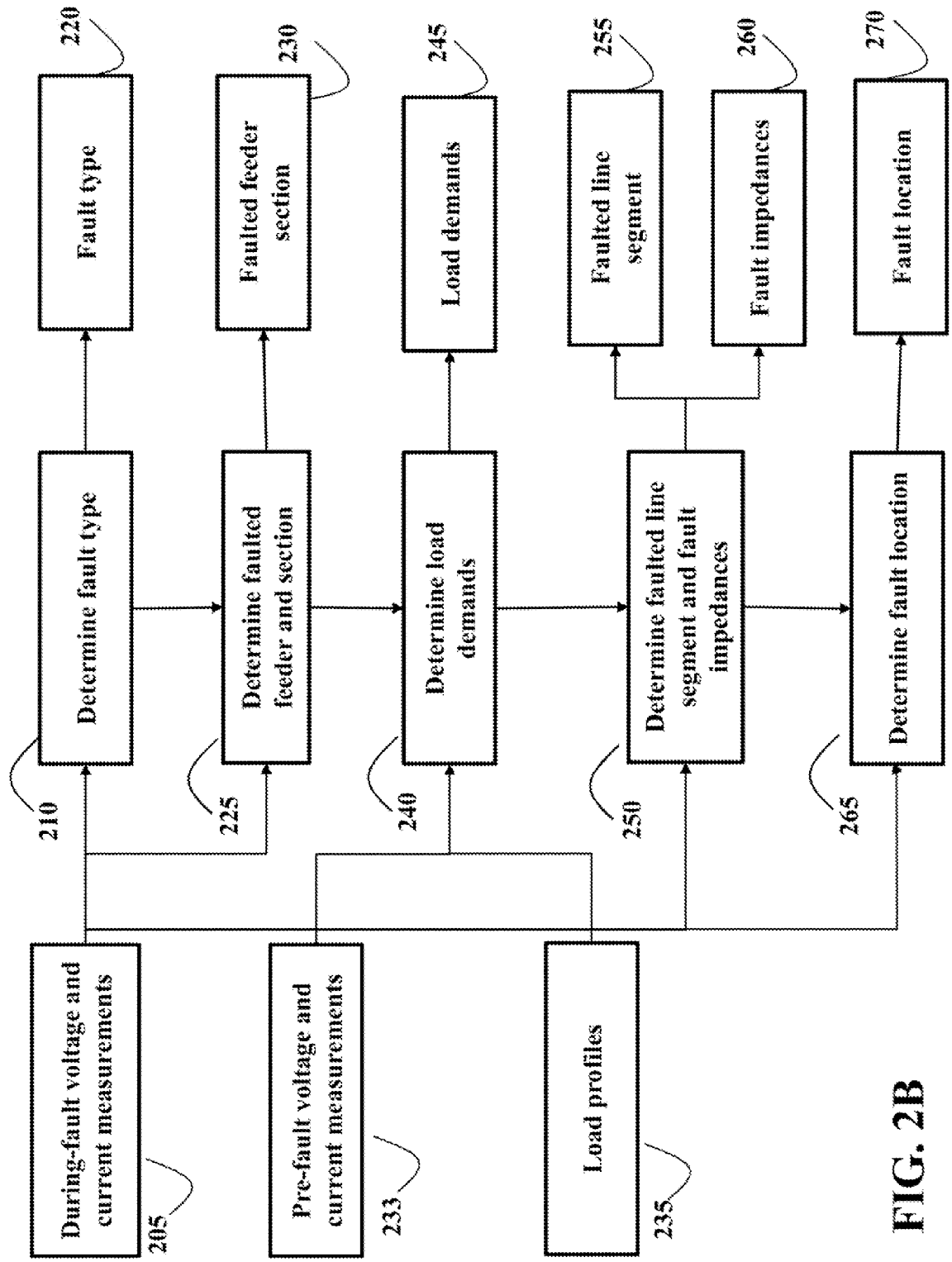

FIG. 2B shows a block diagram of another method for fault location analysis of an ungrounded distribution system according to some embodiments of the invention.

In response to detecting a fault, the fault type 220 is determined 210 based on the voltage and current measurements at the breakers during the fault 205. Then, the possible faulty feeder section 230 is determined 225 for a specific feeder based on the during-fault voltage and current measurements at the switches along the faulty feeder 205.

After the faulty feeder section 230 is determined, the load demands 245 of the faulty feeder section is determined 240 based on the pre-fault voltage and current measurements 233 and the load profiles 235 for individual loads in the feeder section.

The faulty line segment 255 and the fault impedance 260 are determined 250 by using the load demands 245, the fault type 220, and the during-fault measurements 233. The next step includes determining 265 the fault location 270 along the faulty line segment 255.

Determining Type of the Fault

Some embodiments of the invention determine the type of the fault based on the measurements at the feeder breakers taken during the fault, i.e., the during-fault measurements.

Knowing the type of the fault, the faulty feeder and faulty feeder section can be determined based on the during-fault measurements at the switchers of the feeder.

Figure 3:
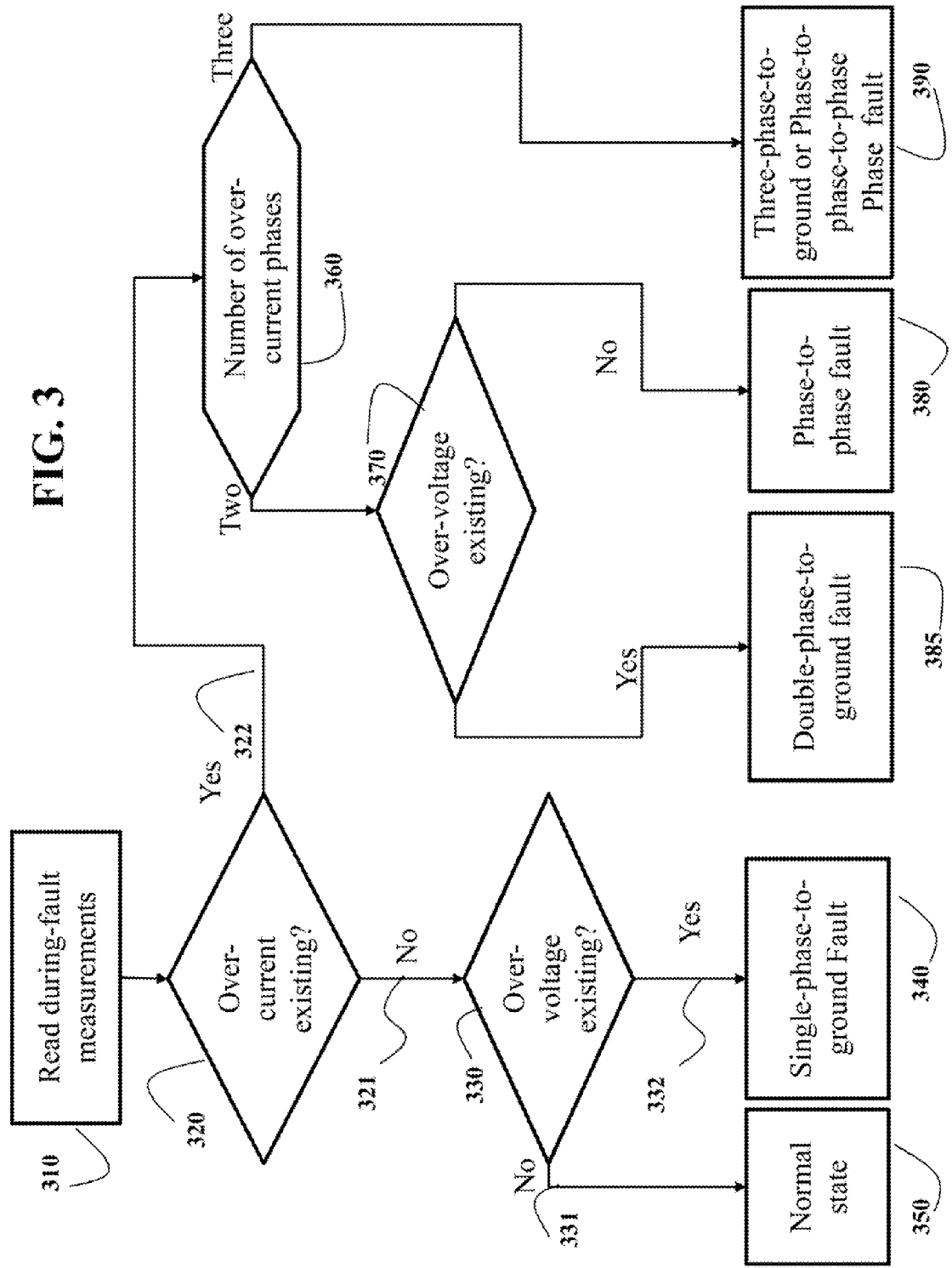
FIG. 3 is a block diagram of a method for determining the type of fault according to some embodiments of invention.

FIG. 3 shows a block diagram of a method for determining the type of fault in ungrounded power distribution system according to one embodiment. The first step includes collecting 310 the during-fault voltage and current measurements at fundamental frequency for the breakers. Using the measured currents, the embodiment checks 320 whether there is over-current existing on any feeder breaker at any phases.

If there is no over-current 321, then the embodiment checks 330 whether there is over-voltage existing on any breaker at any phase using the measured voltages. If there are over-voltages 332, the fault type is single-phase-to-ground fault 340. If there are no over-voltages 331, there is no fault 350 downstream to the feeder breaker.

If there is over-current 322, then there is a double or three phase fault occurring in the system. The type of fault is determined according to the number of phases 360 with over-currents. If there are two phases having over-currents, then the fault is either a double phase to ground 385, or a phase-to-phase 380, and the actual type is further determined by checking 370 whether there is over-voltage on the phase without over-current. If there is over-voltage existing, then the fault type is double-phase-to-ground fault 385. Otherwise, the type of the fault is a phase-to-phase fault 380.

If there are three phases having over-currents, then there is a three-phase-to-ground fault or phase-to-phase-to-phase fault 390 downstream to the feeder breaker.

A phase x is determined as having over-current, when the following condition is met:

$$\frac{|I_{p,x}|}{I_{p,x}^{rated}} \geq \bar{I} \quad (1)$$

$$x \in \{a, b, c\}$$

wherein $|I_{p,x}|$ and $I_{p,x}^{rated}$ are the magnitude of measured current, and rated normal current on phase x at the switch p, $\bar{I}$ is the threshold of current ratio of measured current over rated normal current used for over current status determination. For example, $\bar{I}$ can be set as 3.0. If the rated currents are not available, the pre-fault measured currents can be used instead, but the thresholds need to be adjusted accordingly.

A phase x is determined as having over-voltage, if the following condition is met:

$$|V_{p,x}| \geq \bar{V} x \in \{a,b,c\}, \quad (2)$$

where, $|V_{p,x}|$ is the magnitudes of voltages measured at switch p on the phase x, and $\bar{V}$ is the threshold of voltage magnitude used for over voltage status determination. For example, $\bar{V}$ can be set as 1.40 per unit. Similarly, a phase is determined as having under-voltage, if the following condition is met:

$$|V_{p,x}| \leq \underline{V} x \in \{a,b,c\}, \quad (3)$$

where $\underline{V}$ is the threshold of voltage magnitude used for under voltage status determination, such as 0.3 per unit.

Determining Faulty Feeder and Faulty Feeder Section

Various embodiments determine the faulty feeder and faulty feeder section using different approaches for a single-phase-to-ground fault, and a two or three phase fault. For a multiple phase fault, a feeder is determined as a faulty one, if there are over-currents on its breaker. The phases that have over-currents are the faulty phases. A feeder section is determined as a faulty feeder section, if there are over-currents occurring on multiple phases at its upstream breaker or switch, but not at its downstream switches.

For a single-phase-to-ground fault, a feeder is faulty if the phase angle difference between the residual voltage and residual current measured at the feeder breaker are close to 90 degree:

$$|\angle V_{fdr}^{res} - \angle I_{fdr}^{res} - 90°| < \Delta\bar{\theta} \quad (4)$$

where, $\angle V_{fdr}^{res}$ is the phase angle of residual voltage measured at the feeder breaker, $\angle I_{fdr}^{res}$ is the phase angle of residual current flowing on the feeder breaker, $\Delta\bar{\theta}$ is a threshold for angle difference determination, for example, $\Delta\bar{\theta}$ is set to be 10 degree.

A feeder section is determined as faulty when the angle difference between a residual voltage $V_{up}^{res}$ and a residual current $I_{up}^{res}$ at its upstream switch up is close to 90 degrees:

$$|\angle V_{up}^{res} - \angle I_{up}^{res} - 90°| < \Delta\bar{\theta} \quad (5)$$

and the angle difference between residual voltage $V_{dn}^{res}$ and residual current $I_{dn}^{res}$ at one of its downstream measuring device dn is close to −90 degrees:

$$|\angle V_{dn}^{res} - \angle I_{dn}^{res} - 90°| < \Delta\bar{\theta} \quad (6)$$

If the magnitude of residual current at the upstream switch is close to be zero, only Eq. (6) is used to determine whether there is a fault within the section based on the measurements at the downstream switch. If a feeder section does not have any downstream switch, only Eq. (5) is used to determine whether it is a faulty section using the measurements at the upstream switch.

The residual voltage and current for any device p are determined according to:

$$V_p^{res} = \Sigma_{x \in \{a,b,c\}} V_{p,x}, \text{ and} \quad (7)$$

$$I_p^{res} = \Sigma_{x \in \{a,b,c\}} I_{p,x}. \quad (8)$$

After the fault type and faulty feeder section are identified, the fault locating task is simplified to find a fault location within a section of a feeder for a specific type of fault.

Determining the Load Demands of Faulty Section

The load demands for the faulty feeder section are not measured, but determined based on the available pre-fault measurements at the boundaries of the section and load profiles for each individual load in the section.

Some embodiments of the invention are based on a realization that for a section of a distribution feeder with multiple measuring ports at its boundaries, the measured currents are related with measured voltages by an equivalent admittance matrix which are uniquely determined by the load demands of the section, and the network connections in the section if the loads of the section can be modeled as constant impedances, and there are no other generation sources within the measuring ports.

If the load demands or the network connections are to be determined, the measured voltages and currents can be used to determine whether the estimation for loads or connections are matching or close to the actual situations. Some embodiments determine an equivalent admittance matrix according to the estimated loads or connections, and then determine estimated currents by multiplying the measured voltages by the equivalent admittance. If the estimation is accurate enough, the estimated currents should be matching the measured currents. The closer the estimation is to the actual ones, the lesser is the distance between the estimated currents and the measured ones. For fault location analysis, both load demands and network connection need to be determined. The network connection is determined by the fault type, fault location and fault impedances at the fault location. The fault location is determined by enumerating all reasonable combination of load demand and fault conditions and the final solution is the combination that has minimal distance between the estimated currents and measured currents.

Another realization is that the fault location computation time is heavily depended on the number of the combination of load demand and fault condition to be enumerated. To reduce the computation burden, one embodiment partitions the fault location task into several independent sub-tasks, and each sub-task requires much lesser computation and is capable of applying simplified models. The fault locating is achieved through fault type determination, faulty feeder section determination, determining of load demands of faulty section, determining of faulty line segment and fault impedances, and determining of fault location among the faulty line segment.

In addition, some embodiments are based on the observation that the exact load at each load bus is unknown. Thus, some embodiments determine the load demands of the feeder section using the pre-fault voltage and current measured at the feeder section and load profiles for individual loads in the section. Each load is defined as a product of base load given by load profile and a set of uniform load scaling factors for all loads in the section. The set of load scaling factors for each phase pair of DELTA-connected loads are determined by finding a set of load scaling factors that enable the estimated currents at the measuring ports maximally matching the measured currents at the measuring ports of the feeder section.

The individual DELTA-connected loads in the section are treated as scalable loads. The power consumptions of an individual load connected to bus p, $S_{p,xy}$ are defined as:

$$S_{p,xy} = \alpha_{xy} S_{p,xy}^{base} \quad xy \in \{ab, bc, ca\}, \tag{9}$$

where $S_{p,xy}^{base}$ is the base power consumption given by load profile for the time interval of fault occurring, $\alpha_{xy}$ is an uniform scaling factor used for all load components between phase x and phase y in the feeder section.

The load scaling factors are determined by finding a set of scaling factors that enable the measured currents are maximally matching with the estimated currents determined as a product of equivalent admittance matrix for the section and measured voltages.

Figure 4:
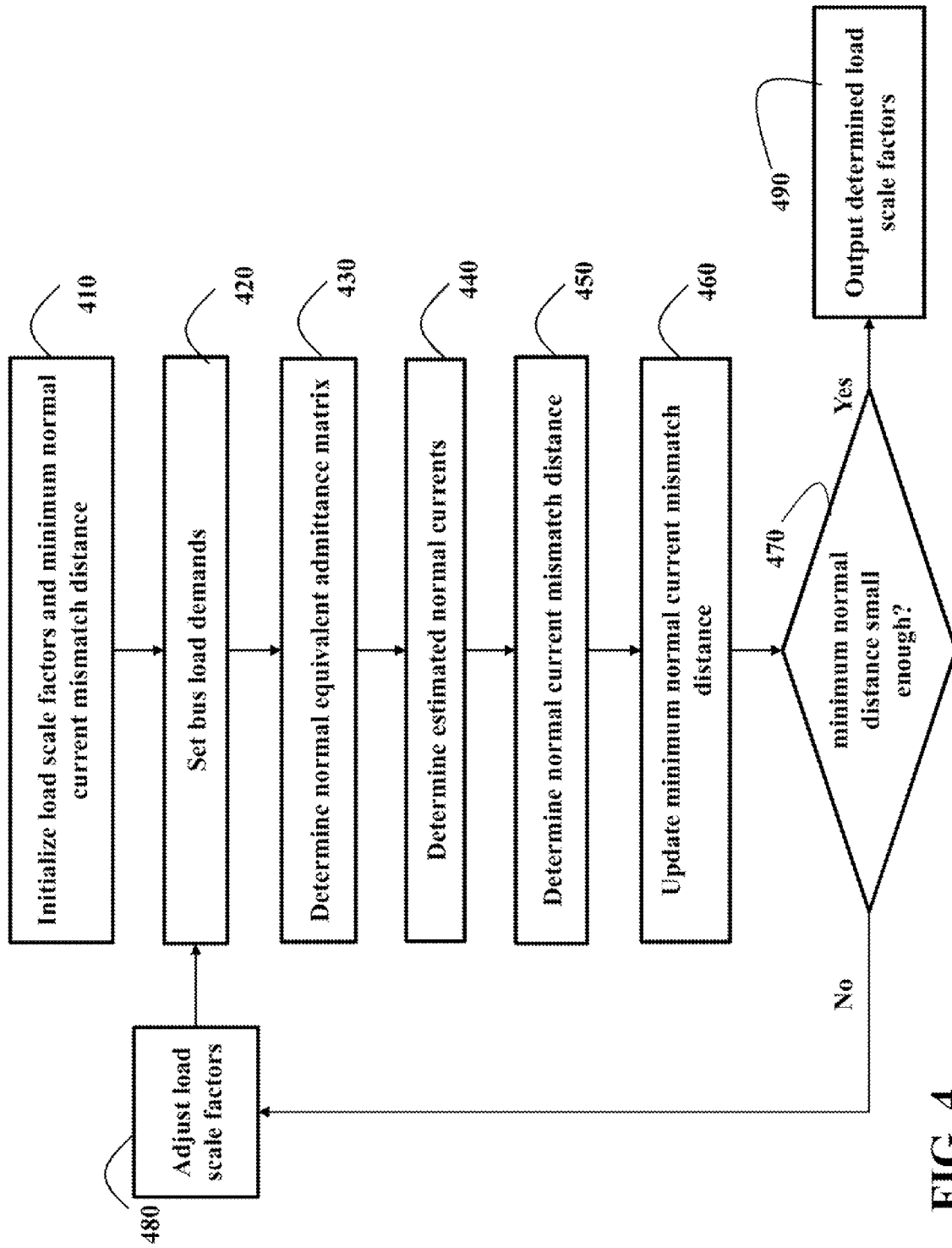
FIG. 4 is a block diagram of a method for determining the load demands of a feeder section according to some embodiments of invention.

FIG. 4 shows a block diagram of various steps of a method for determining the scaling factors according to some embodiments of the invention.

Step-410: Initializing the load scaling factors for each pair of phases, and minimum distance for normal current mismatch, $d_{min}^{normal}$;

Step-420: Calculating the load demands for each bus using the given scale factors;

Step-430: Determining the normal equivalent admittance by modeling loads as constant impedances between phases, $Y_{eqv}^{normal}$.

Step-440: Determining the estimated injected currents, $I_{est}^{normal}$ by multiplying the normal equivalent admittance matrix with measured pre-fault voltages:

$$I_{est}^{normal} = Y_{eqv}^{normal} V_{meas}^{normal} \tag{10}$$

where, $V_{meas}^{normal}$ is the vector of measured phase-to-ground voltages for all phases of all measured ports.

Step-450: Comparing the estimated injected currents with the measured currents, and determining the Euclidean distance for the normal current mismatch according to:

$$d_{cur}^{normal} = \|I_{meas}^{normal} - I_{est}^{normal}\| \tag{10}$$

where, $I_{meas}^{normal}$ at is the vector of injected currents of all phases for each measured port determined according to the measured currents at the ports.

Step-460: Updating the minimum distance $d_{min}^{normal}$ with present distance $d_{cur}^{normal}$ if the present distance is smaller than the minimum distance.

Step-470: If minimum distance $d_{min}^{normal}$ is small than a given threshold, go to step 490, then the current load scaling factors are the final solution. Otherwise, go to step 480 to adjust the scaling factors for each phase pair with small increments or decrements, and go to step-420.

Determining the Faulty Line Segment and Fault Impedance

After the fault type is determined, some embodiments determine the line segment of the location of the fault, and the fault impedances for the fault location. The faulty line segment in the faulty section and associated fault impedance at the fault location is determined by examining each line segments in the section under a reasonable range of fault impedances and finding the line segment and associated fault impedance condition that has the minimum distance for fault current mismatches.

For example, for each line segment, two points in the vicinity of its terminals are selected to evaluate the distance for current mismatches under various fault conditions, e.g., one point is close to the upstream terminal of the segment, and the other point is close to the downstream terminal of the segment. For example, the upstream point can be selected as one that is 0.00001 km downstream from the upstream terminal of the segment, and the downstream point is 0.00001 km upstream from downstream terminal. The minimal among the distances for fault current mismatches determined for two points is used to represent the distance of fault current mismatches for the segment.

Figure 5:
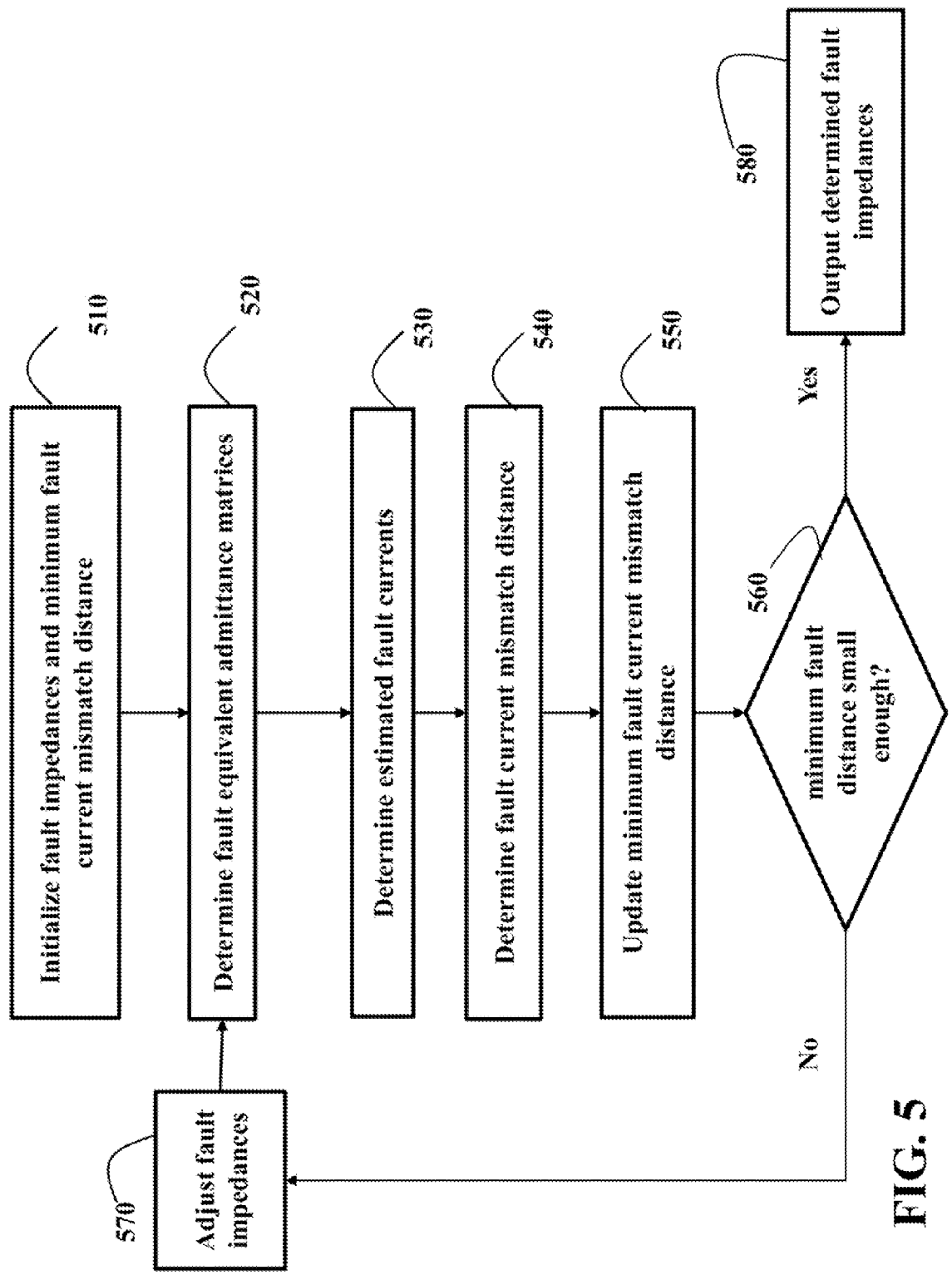
FIG. 5 is a block diagram of a method for determining fault impedances for a fault at the terminal buses of a line segment according to some embodiments of invention.

FIG. 5 shows a block diagram of a method that, for each line segment l, determines the fault condition that has minimal fault current mismatches according to one embodiment.

Step-510: Initializing the fault impedances with zeros, and minimum distance for fault current mismatch for the segment, $d_{min,l}^{fault}$;

Step-520: Applying a fault with determined fault type and fault impedances to the upstream and downstream points separately, and then determining the fault equivalent admittances for each point accordingly;

Step-530: Determining the estimated injected currents at the two selected points, $I_{est,l,up}^{fault}$ and $I_{est,l,dn}^{fault}$ by multiplying the fault equivalent admittance matrices with measured during-fault voltages:

$$I_{est,l,up}^{fault} = Y_{eqv,l,up}^{fault} V_{meas}^{fault} \tag{12}$$

$$I_{est,l,dn}^{fault} = Y_{eqv,l,dn}^{fault} V_{meas}^{fault} \tag{13}$$

where, $V_{meas}^{fault}$ is the vector of measured phase-to-ground voltages for all phases of all measured ports.

Step-540: Comparing the estimated injected currents with the measured currents, and determining the Euclidean distances for the fault current mismatch according to:

$$d_{cur,l}^{fault} = \min\{\|I_{meas}^{fault} - I_{est,l,up}^{fault}\|, \|I_{meas}^{fault} - I_{est,l,dn}^{fault}\|\} \tag{14}$$

where, $I_{meas}^{fault}$ is the vector of injected currents for each phase of all measured ports determined according to the measured currents at the ports.

Step-550: Updating the minimum distance $d_{min,j}^{fault}$ with present distance $d_{cur,j}^{fault}$ if the present distance is smaller than the minimum distance.

Step-560: If minimum distance $d_{min,j}^{fault}$ is small than a given threshold, go to step 580, the fault impedances are the final solution. Otherwise, go to step 570 to adjust the fault impedances with small increments or decrements, and go to step-520.

Determining the Faulty Location within the Faulty Line Segment

The fault location is determined by finding a location along the determined fault line segment with given type of fault and fault condition that enable the measured during-fault currents are maximally matching with the estimated fault currents determined as a product of corresponding equivalent fault admittance matrix for the section and measured voltages during the fault.

Figure 6:
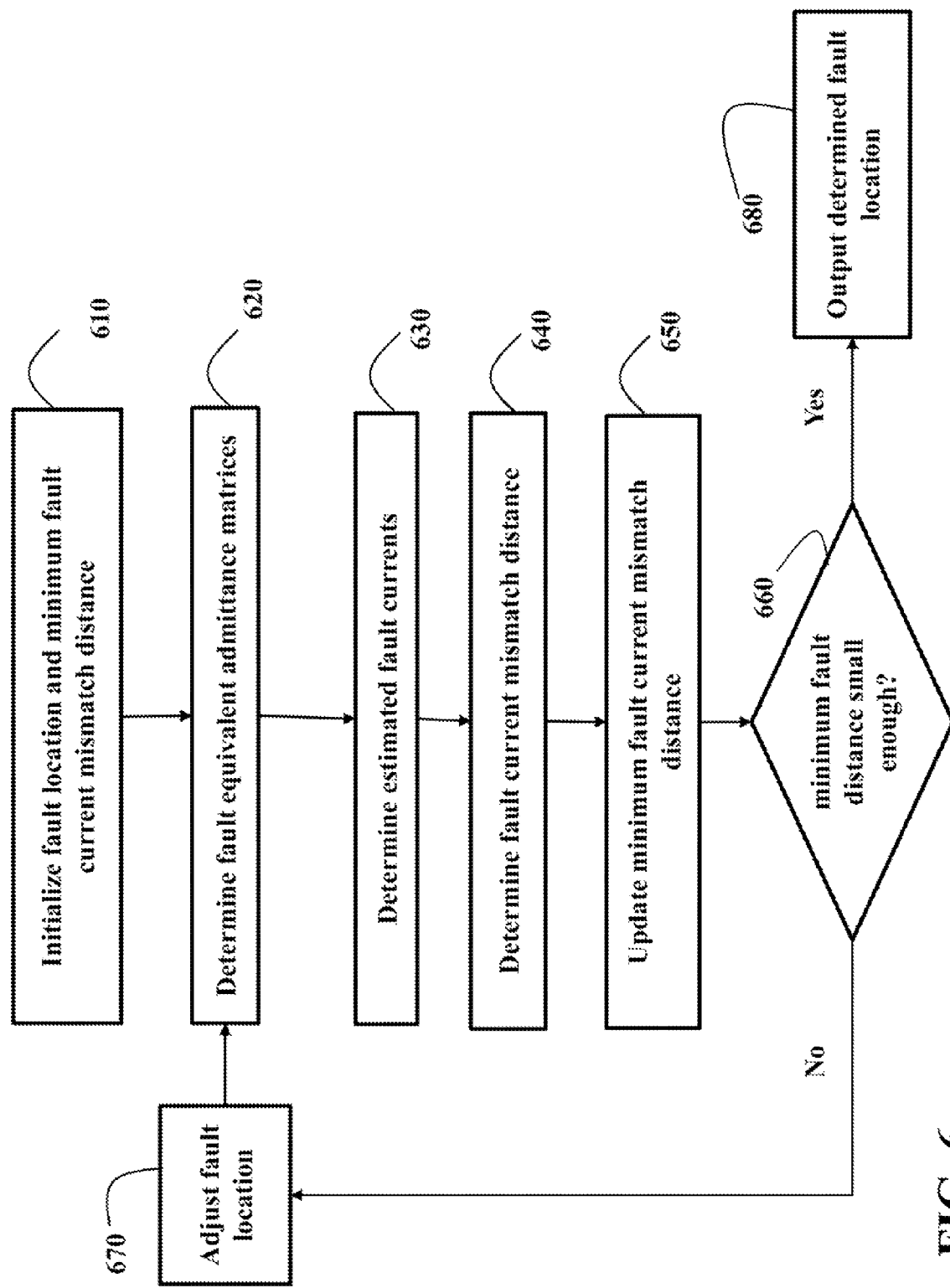
FIG. 6 is a block diagram of a method for determining fault location along a line segment.

FIG. 6 shows a block diagram of a method for determining the fault location according to one embodiment.

Step-610: Setting the fault location, loc at a upstream point close to the upstream terminal of the segment, and initializing the minimum distance for fault current mismatch, $d_{min,loc}^{fault}$;

Step-620: applying the given type of fault and fault impedances to the fault location, and determining the fault equivalent admittance, $d_{eqv,loc}^{fault}$ Step-630: determining the estimated injected currents, $I_{est,loc}^{fault}$ by multiplying the fault equivalent admittance matrix with measured voltages during the fault:

$$I_{est,loc}^{fault} = Y_{eqv,loc}^{fault} V_{meas}^{fault} \quad (15)$$

Step-640: Comparing the estimated injected currents with the measured currents, and determining the Euclidean distance for the fault current mismatch according to:

$$d_{cur,loc}^{fault} = \|I_{meas}^{fault} - I_{est,loc}^{fault}\| \quad (16)$$

Step-650: Updating the minimum distance $d_{min,loc}^{fault}$ with present distance $d_{cur,loc}^{fault}$ if the present distance is smaller than the minimum distance.

Step-660: If minimum distance $d_{min,loc}^{fault}$ is small than a given threshold, go to step 680, the current location is the final solution. Otherwise, go to step 670 to move the fault location along the segment downstream with a small step if it does reach at the downstream point, and go to step-620.

Determining Equivalent Admittance for One-Port Feeder Section

The computation of fault locating can be further simplified by efficiently determining the equivalent admittance matrix for various load and fault conditions. One embodiment uses a topology analysis based method for a feeder section with one or two measuring ports, and a Kron reduction based method for a feeder section with more than two measuring ports.

When there are two measuring ports existing, the topology analysis based method determines the equivalent admittance matrix by sequentially determining the equivalent admittance matrix for a portion of the feeder section between the upstream bus of a line segment on the path between measuring ports and the downstream measuring port from ones connected to the last layer and to the first layer. Similarly, when there is only one measuring port existing, the topology analysis based method determines the equivalent admittance matrix by sequentially determining the equivalent admittance matrix for a portion of the feeder section downstream to the upstream bus of a line segment from downstream to upstream.

The Kron reduction based method determines the equivalent admittance matrix by removing the admittance items related to the buses without injected currents from the full equivalent admittance matrix for the feeder section.

Assumed the loads of a feeder section are constant impedance loads. If the system conditions are given, the feeder section can be fully represented by using the following equations:

$$I_{port} = Y_{eqv} V_{port}, \quad (17)$$

where, $I_{port}$ is the vector of injected currents for all phases of measuring ports, $V_{port}$ is the vector of terminal voltages for all phases of measuring ports, and $Y_{eqv}$ is the equivalent admittance matrix of the section. For a normal operating state, the system condition is determined if the load demands are given. For a fault operating state, besides the load demands, the system condition is determined if the fault location, fault type and associated fault impedances are given.

For a one-port or two-port feeder section, the equivalent admittance matrix can be determined through topology analysis of branch connections and admittance models of branches.

Figure 7:
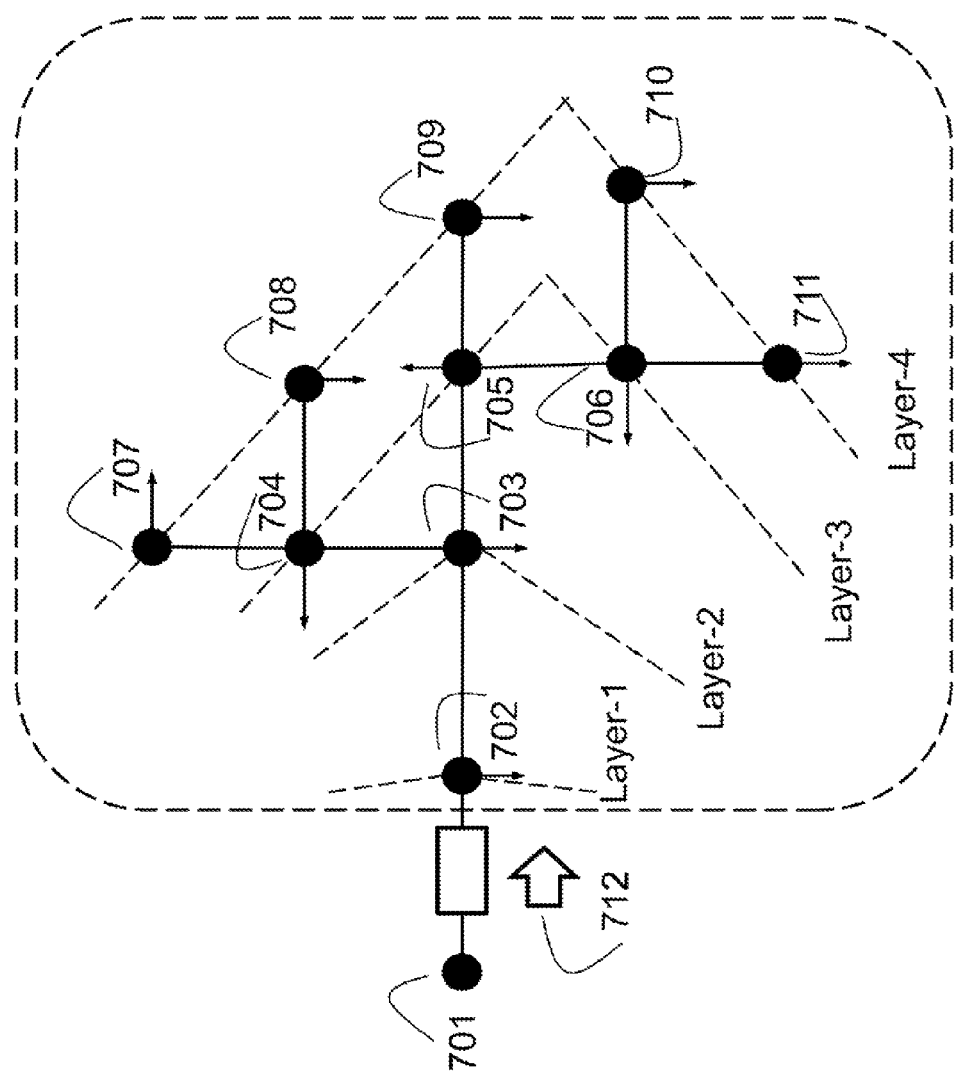
FIG. 7 is a schematic of a feeder section with one measuring port.

FIG. 7 shows an example of one-port feeder section. The section has only one measuring port at the switch 712. Based on the number of connected devices between the bus of interest and the measuring port, the feeder section can be divided into several layers. The section in FIG. 7 has 4 layers. Layers 1 and 2 have one bus each. Layer 1 includes the bus 702 which is the downstream bus of switch 712. Layer 2 includes the bus 703. Layer 3 includes the buses 704, 705 and 706. Layer 4 includes the buses 707, 708, 709, 710 and 711.

The following admittance model is used to model a branch connected between a bus p and a bus s:

$$\begin{bmatrix} I_{ps} \\ I_{sp} \end{bmatrix} = \begin{bmatrix} Y_{ps}^{pp} & Y_{ps}^{ps} \\ Y_{ps}^{sp} & Y_{ps}^{ss} \end{bmatrix} \begin{bmatrix} V_p \\ V_s \end{bmatrix}, \quad (18)$$

where, $I_{ps}$ and $I_{sp}$ are the vectors of injected currents for all phases at bus p and bus s through the branch between bus p and bus s, $V_p$ and $V_s$ are the vectors of voltages for all phases at bus p and bus s respectively. $Y_{ps}^{pp}$ and $Y_{ps}^{ss}$ are the self-admittance matrix elements at bus p and bus s, and $Y_{ps}^{ps}$ and $Y_{ps}^{sp}$ are the mutual admittance matrices between bus p and bus s, and bus s and bus p, respectively. The self and mutual admittances are depended on the type of branches during normal operation, and the type of fault and fault impedances during fault operations.

Figure 8:
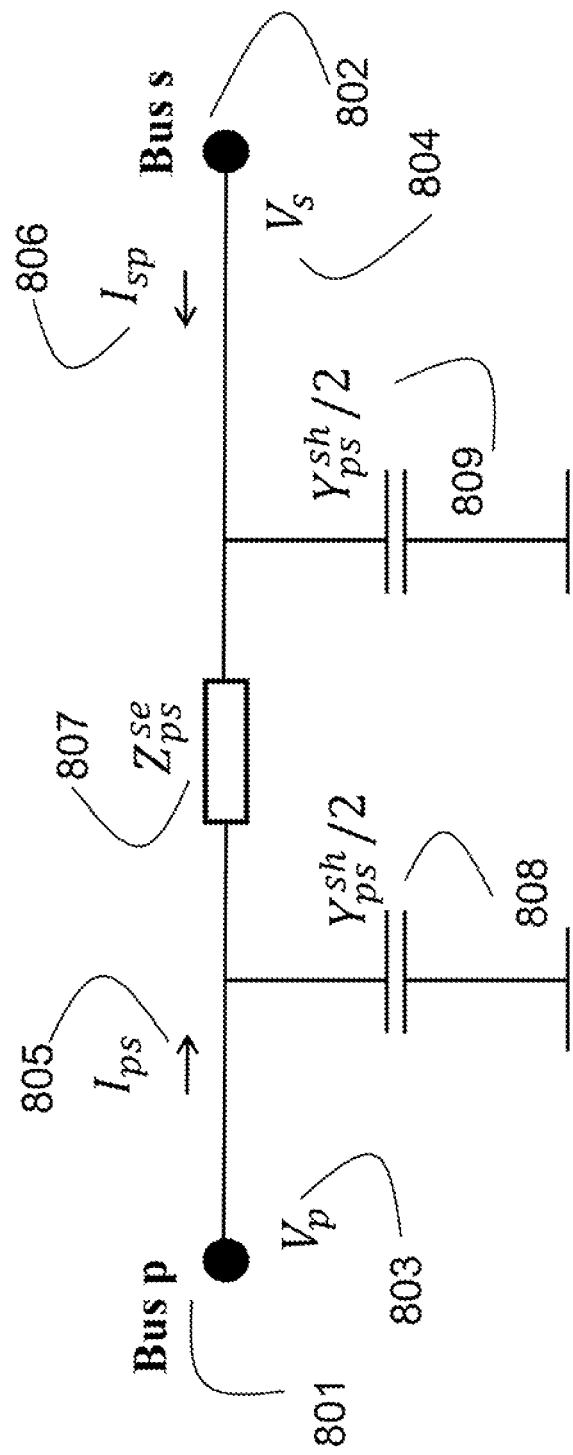
FIG. 8 is a schematic of a line segment with series impedance and shunt admittance.

FIG. 8 shows an example of a line segment between an upstream bus p 801 and a downstream bus s, 802. The line segment is modeled by a series phase impedance matrix $Z_{ps}^{se}$ 807, and a shunt admittance matrix $Y_{ps}^{sh}$ partitioned into two terminal buses, 808, and 809. The self-admittance and mutual matrices are determined according to:

$$Y_{ps}^{pp} = Y_{ps}^{ss} = Y_{ps}^{se} + \frac{Y_{ps}^{sh}}{2} \quad (19)$$

$$Y_{ps}^{ps} = Y_{pp}^{sp} = -Y_{ps}^{se} \quad (20)$$

where, $Y_{ps}^{se}$ is the line series admittance, and equal to the inverse of the series impedance matrix, $Y_{ps}^{se} = Z_{ps}^{se^{-1}}$.

Figure 9:
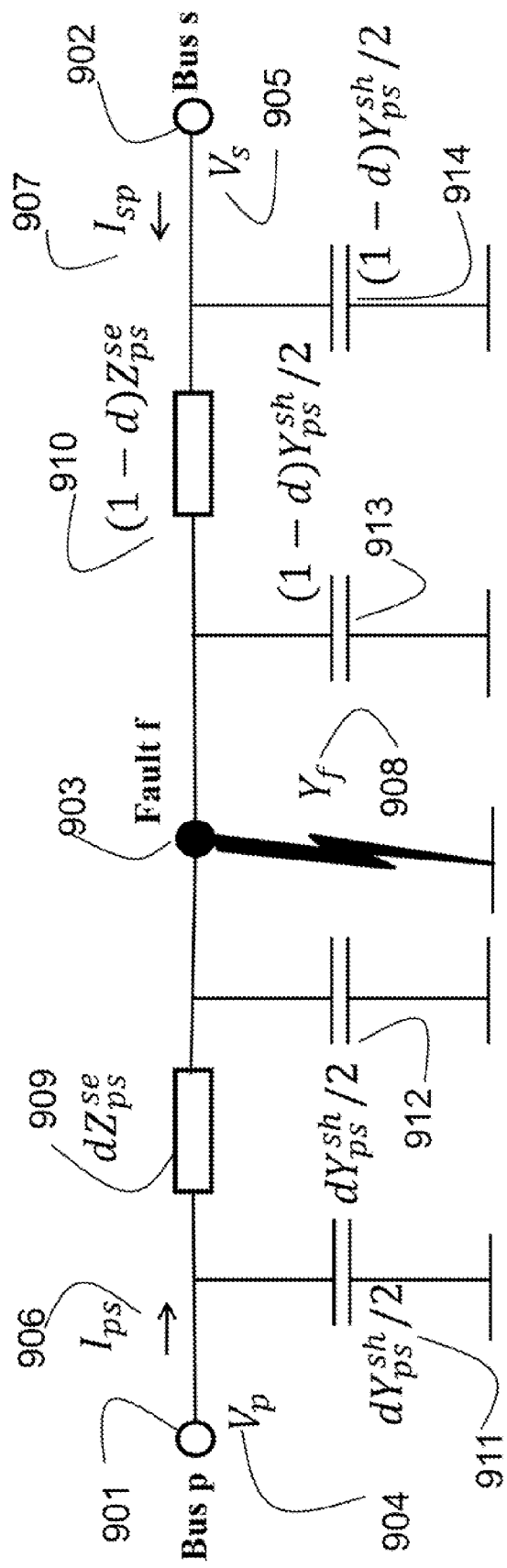
FIG. 9 is a schematic of line segment with a single-phase-to-ground fault.

FIG. 9 shows a model of line segment between an upstream bus p, 901 and a downstream bus s, 902 with a fault at the location f, 903 within the segment. The line segment is partitioned into two sub-segments according to the location of the fault, one is between bus p, 901 and the location of fault f, 903, and the other is between location of the fault f, 903 and bus s, 902. Assumed d is the ratio of distance between the fault location f, 903 and the upstream bus p, 901 over total length of the line segment between bus p and bus s, the sub-segment between bus p, 901 and fault location f, 903 is modeled with a series impedance matrix $dZ_{ps}^{se}$, 909 and a shunt admittance matrix $dY_{ps}^{sh}$ split into two terminal buses, p and f, 911 and 912 and the sub-segment between fault location f, 903 and bus s, 902 is modeled with a series impedance matrix $(1-d)Z_{ps}^{se}$, 910, and a shunt admittance matrix $(1-d)Y_{ps}^{sh}$ split into two terminal buses, f and s, 913 and 914.

The self and mutual admittance matrices for the fault line segment are defined as:

$$Y_{ps}^{pp} = \frac{Y_{ps}^{se}}{d} + \frac{dY_{ps}^{sh}}{2} - \frac{Y_{ps}^{se}T^T}{d}\left(\frac{TY_{ps}^{se}T^T}{d(1-d)} + \frac{TY_{ps}^{sh}T^T}{2} + Y_f\right)^{-1}\frac{TY_{ps}^{se}}{d} \quad (21)$$

$$Y_{ps}^{ps} = Y_{ps}^{sp} = -\frac{Y_{ps}^{se}T^T}{d}\left(\frac{TY_{ps}^{se}T^T}{d(1-d)} + \frac{TY_{ps}^{sh}T^T}{2} + Y_f\right)^{-1}\frac{TY_{ps}^{se}}{1-d} \quad (22)$$

$$Y_{ps}^{ss} = \frac{Y_{ps}^{se}}{1-d} + \frac{(1-d)Y_{ps}^{sh}}{2} - \frac{Y_{ps}^{se}T^T}{1-d}\left(\frac{TY_{ps}^{se}T^T}{d(1-d)} + \frac{TY_{ps}^{sh}T^T}{2} + Y_f\right)^{-1}\frac{TY_{ps}^{se}}{1-d} \quad (23)$$

where, T is a transformation matrix used for modeling the impacts of the fault and defined according to the type of fault. $Y_f$ is a shunt admittance matrix of the fault point f. The shunt admittance matrix of the fault point, $Y_f$ is a 3-by-3 matrix, and determined according to the impedances between the fault point and the ground, and the faulty phases of the fault point. For a bolted fault, $Y_f$ is a zero matrix.

A backward sweep procedure can be used to determine the equivalent admittance matrix for the feeder section. The procedure starts from the branches connected to the last year of the feeder section, then moves upstream until reaches at the switch at the measuring port.

Figure 10:
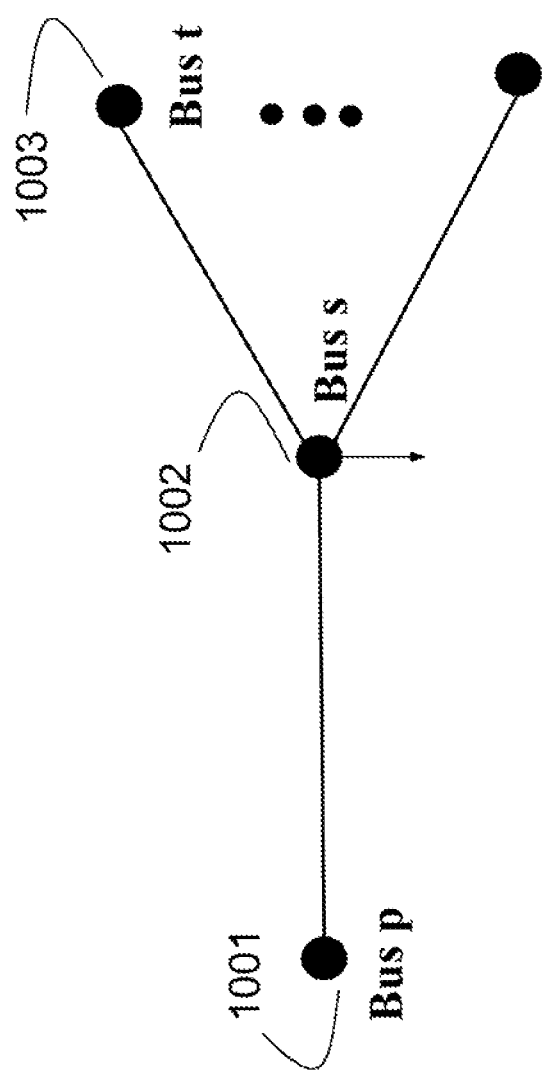
FIG. 10 is a schematic of a line segment and its downstream line segments.

For each branch between an upstream bus p, and a downstream bus s, an equivalent 1-port admittance matrix $Y_{ps}^{1port}$ for the portion of the feeder section defined by the line segment between bus p and bus s and all devices downstream to the bus s is determined on loads at the downstream bus s, and branches connected downstream to bus s. Taking FIG. 10 as an example, bus p 1001 is upstream to bus s 1002, and bus t 1003 is downstream to bus s 1002. The equivalent admittance matrix for the portion of section defined by the line segment between bus p and bus s and all devices downstream to the bus s is determined according to:

$$Y_{ps}^{1port} = Y_{ps}^{pp} - Y_{ps}^{ps}(Y_{ps}^{ss} + Y_s^{load} + Y_s^{cap} + \Sigma_{t \in DD_s} Y_{st}^{1port})^{-1} Y_{ps}^{sp}, \quad (24)$$

where $Y_s^{load}$ and $Y_s^{cap}$ are the equivalent admittance matrices of loads and capacitors connected to bus s, $Y_{st}^{1port}$ is the equivalent 1-port admittance matrix for the portion of the feeder section defined by the line segment between bus s and bus t and all devices downstream to the bus t, $DD_s$ is the set of downstream branches that directly connected to bus s.

FIG. 7 shows the one-port feeder section, for which some embodiments calculate the equivalent admittance matrices for the branches connected upstream to buses at the layer 4, then calculate the equivalent admittance matrices for branches connected upstream to layer 3, and 2 and 1 respectively. The determined one-port equivalent admittance for the last branch corresponding to the upstream measuring port is the required solution for the feeder section.

Determining Equivalent Admittance for Two-Port Feeder Section

Figure 11:
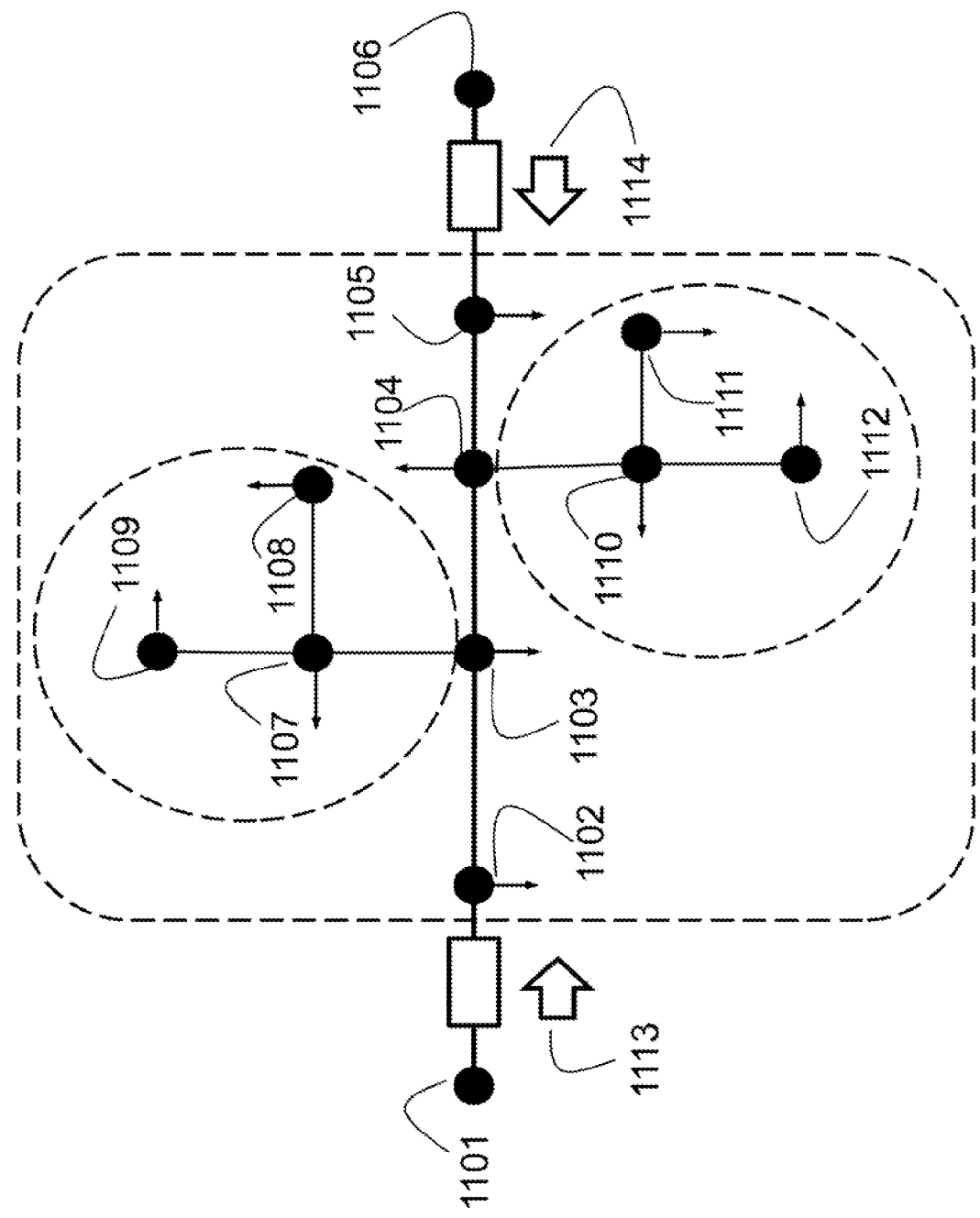
FIG. 11 is a schematic of a feeder section with two measuring ports.

FIG. 11 gives an example of two-port feeder section. The section has two measuring ports, one at the switch 1113, and the other at the switch 1114. The two-port feeder section is divided into a main line and several laterals. The main line includes all devices that reside on the shortest path between two measuring ports. The laterals are fed from one main line bus, and include all devices downstream to the main line bus. In FIG. 11, the main line includes the buses 1101, 1102, 1103, 1104, 1105, and 1106. There are two laterals, one is starting from bus 1103, and including the buses 1107, 1108, and 1109, and the other is starting from the bus 1104, and including the buses 1110, 1111, and 1112.

The equivalent admittance for the two-port feeder section can be determined through two-step procedure. The first step is treating each lateral as one-port feeder section and determining 1-port equivalent admittance matrix for each lateral using the method discussed above. The second step is an upward sweep procedure that starts calculating the 2-port equivalent admittance matrix for a portion of the feeder section between the upstream bus of a line segment and the downstream measuring ports. The second step starts from the most downstream branch on the main line, and moves upstream along the mainline, and ends at the most upstream branch.

For a main line branch between an upstream bus p and a downstream bus s, a 6-by-6 equivalent admittance matrix, $Y_{ps-dn}^{2port}$ is used to represent the relationship of voltages and injected currents of two-port feeder section between the upstream bus p of the branch between bus p and bus s, and the downstream measuring port, dn. This equivalent admittance matrix includes four 3-by-3 sub-matrices:

$$Y_{ps-dn}^{2port} = \begin{bmatrix} Y_{ps-dn}^{2port,pp} & Y_{ps-dn}^{2port,pd} \\ Y_{ps-dn}^{2port,dp} & Y_{ps-dn}^{2port,dd} \end{bmatrix}, \quad (25)$$

where $Y_{ps-dn}^{2port,pp}$ and $Y_{ps-dn}^{2port,dd}$ are the self-admittance matrices for the branch between bus p and bus s, and the downstream measuring port. $Y_{ps-dn}^{2port,pd}$ and $Y_{ps-dn}^{2port,dp}$ are the mutual admittance matrices between the branch between bus p and bus s, and the downstream measuring port, and the downstream measuring port, and the branch between bus p and bus s. Similarity, for a branch between an upstream bus s, and downstream bus t, we can have:

$$Y_{st-dn}^{2port} = \begin{bmatrix} Y_{st-dn}^{2port,ss} & Y_{st-dn}^{2port,sd} \\ Y_{st-dn}^{2port,ds} & Y_{st-dn}^{2port,dd} \end{bmatrix}, \quad (26)$$

where, $Y_{st-dn}^{2port}$ is the two-port equivalent admittance matrix for the section between the upstream bus of branch between bus s and bus t, and the downstream measuring port dn. $Y_{st-dn}^{2port,ss}$ and $Y_{st-dn}^{2port,dd}$ are the self-admittance matrices for the branch between bus s and bus t, and the downstream measuring port dn. $Y_{st-dn}^{2port,sd}$ and $Y_{st-dn}^{2port,ds}$ are the mutual admittance matrices between the branch between bus s and bus t, and the downstream measuring port dn, and the downstream measuring port dn, and the branch between bus s and bus t.

Figure 12:
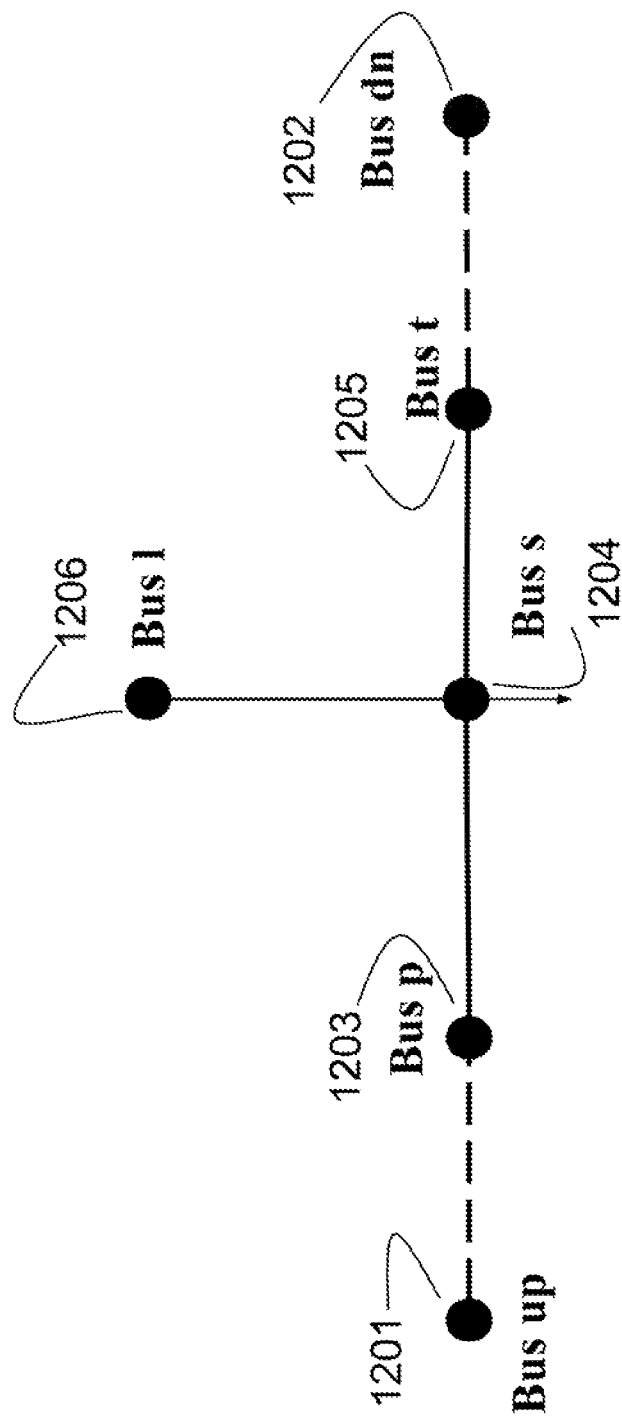
FIG. 12 is a schematic of a line segment on the main line and its connected devices in the laterals and downstream main line.

Taking FIG. 12 as an example, the main line includes bus up, bus p, bus s, bus t, and bus dn. There is a lateral connected to a main line bus s, 1204. The lateral includes bus s 1204, and bus l, 1206. The 2-port equivalent admittance matrix between the upstream bus p of line segment between bus p and bus s, and the downstream measuring port dn is determined according to:

$$Y_{ps\text{-}dn}^{2port,pp} = Y_{ps}^{pp} - Y_{ps}^{ps}(Y_{st\text{-}dn}^{2port,ss} + Y_s^{load} + Y_s^{cap} + \sum_{l \in LT_s} Y_{sl}^{1port})^{-1} Y_{ps}^{sp} \quad (27)$$

$$Y_{ps\text{-}dn}^{2port,pp} = Y_{ps}^{pp} - Y_{ps}^{ps}(Y_{st\text{-}dn}^{2port,ss} + Y_s^{load} + Y_s^{cap} + \sum_{l \in LT_s} Y_{sl}^{1port})^{-1} Y_{ps}^{sp} \quad (27)$$

$$Y_{ps\text{-}dn}^{2port,pd} = -Y_{ps}^{ps}(Y_{st\text{-}dn}^{2port,ss} + Y_s^{load} + Y_s^{cap} + \sum_{l \in LT_s} Y_{sl}^{1port})^{-1} Y_{st\text{-}dn}^{2port,sd} \quad (28)$$

$$Y_{ps\text{-}dn}^{2port,pd} = -Y_{st\text{-}dn}^{2port,ds}(Y_{st\text{-}dn}^{2port,ss} + Y_s^{load} + Y_s^{cap} + \sum_{l \in LT_s} Y_{sl}^{1port})^{-1} Y_{ps}^{sp} \quad (29)$$

$$Y_{st\text{-}dn}^{2port,dd} = Y_{st\text{-}dn}^{2port,dd} - Y_{st\text{-}dn}^{2port,ds}(Y_{st\text{-}dn}^{2port,ss} + Y_s^{load} + Y_s^{cap} + \sum_{l \in LT_s} Y_{sl}^{1port})^{-1} Y_{st\text{-}dn}^{2port,sd} \quad (30)$$

where $LT_s$ is the set of buses on the laterals and connected to the main line bus s. $Y_{sl}^{1port}$ is the 1-port equivalent admittance matrix for the lateral downstream to the upstream bus of the branch between an upstream bus s and a downstream bus l.

For the feeder section shown in FIG. 11, we first determine the one-port equivalent admittance matrices for the laterals connected to bus 1103, and bus 1104. Then the two-port equivalent admittance matrices are determined for the branches on the main line sequentially from the downstream to the upstream. It starts from the branch between bus 1104 and bus 1105, and then moves to the branch between bus 1103 and bus 1104, the branch between bus 1102 and 1103, and the branch between bus 1101 and bus 1102. The determined two-port equivalent admittance for the last branch corresponding to the upstream measuring port is the required solution for the feeder section.

Determining Equivalent Admittance for Multi-Port Feeder Section

For a multi-port feeder section, the equivalent admittance matrix can be determined through a Kron reduction on the full admittance matrix for all buses of the feeder section. For the feeder section, we first build an equivalent admittance matrix to cover all phases of each bus in the feeder section:

$$I_{all} = Y_{full}^{sect} V_{all} \quad (31)$$

wherein, $I_{all}$ is the vector of injected currents for all phases of each bus in the section, $V_{all}$ is the vector of voltages on all phases of each bus in the section, $Y_{full}^{sect}$ is the full admittance matrix for the feeder section. All loads and capacitors are converted into impedances to be included in the full admittance matrix.

A Kron reduction is applied to the full admittance matrix to remove all buses with zero injected currents. After the reduction, only the buses at the terminals of measuring ports are left:

$$I_{port} = Y_{eqv}^{mport} V_{port} \quad (32)$$

wherein, $I_{port}$ is the vector of injected currents for all phases of each measuring port in the section, $V_{port}$ is the vector of voltages on all phases of each measuring port in the section, $Y_{eqv}^{mport}$ is the required multi-port equivalent admittance matrix for the feeder section.

Figure 13:
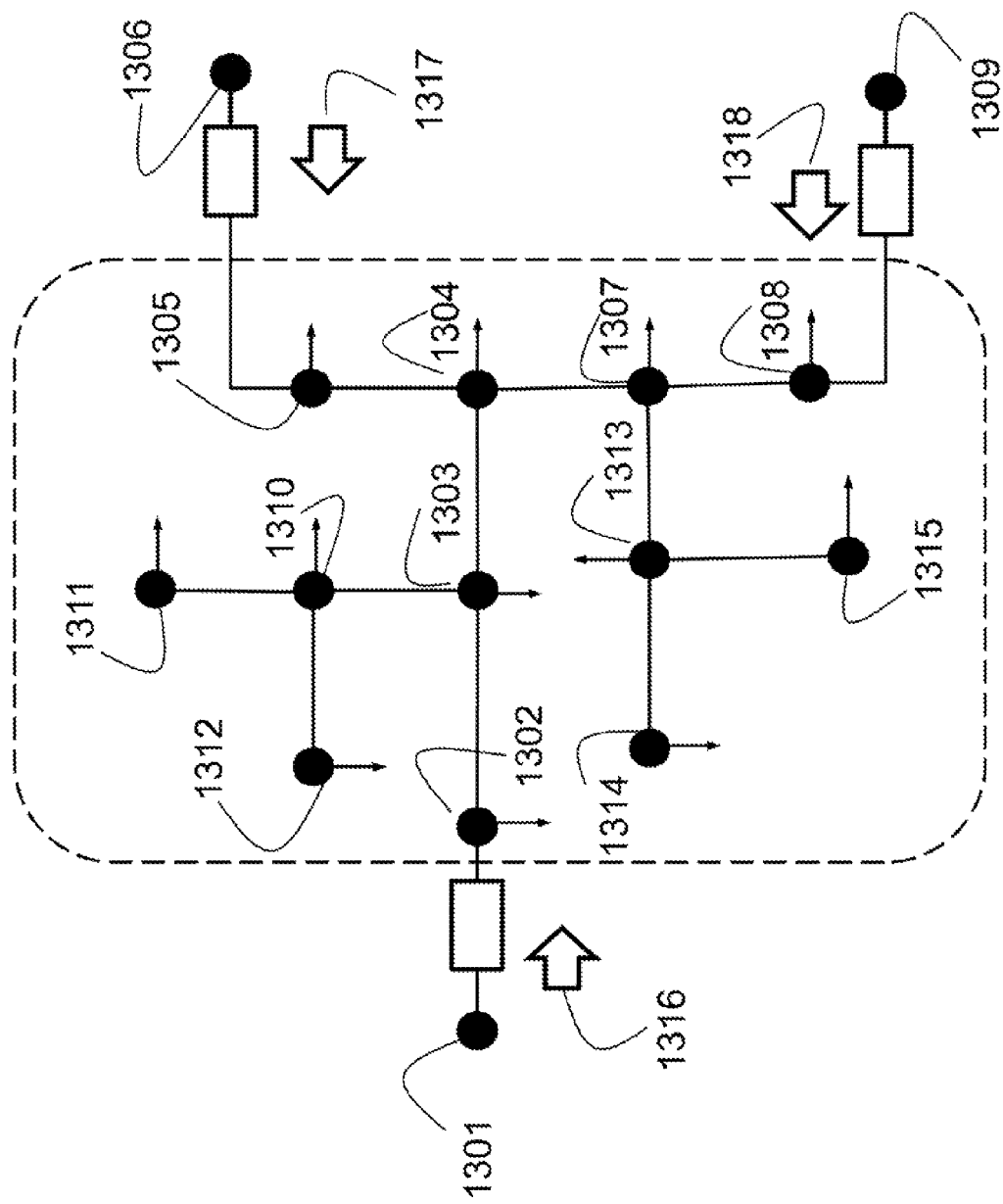
FIG. 13 is a schematic of a feeder section with three measuring ports.

FIG. 13 shows an example of multi-port feeder section. The section has three measuring ports located at the switch 1316, 1317 and 1318 respectively. For the section, we first build a full admittance matrix to include all buses in the section. Then a Kron reduction is applied to the full matrix to remove all buses except bus 1301, 1306 and 1309. The reduced admittance matrix is the equivalent multi-port equivalent admittance matrix that we used for fault location analysis.

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component. Though, a processor may be implemented using circuitry in any suitable format. The processor can be connected to memory, transceiver, and input/output interfaces as known in the art.

Also, the various methods or processes outlined herein may be coded as software that is executable on one or more processors that employ any one of a variety of operating systems or platforms. Alternatively or additionally, the invention may be embodied as a computer readable medium other than a computer-readable storage medium, such as signals.

The terms "program" or "software" are used herein in a generic sense to refer to any type of computer code or set of computer-executable instructions that can be employed to program a computer or other processor to implement various aspects of the present invention as discussed above.

Use of ordinal terms such as "first," "second," in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Although the invention has been described with reference to certain preferred embodiments, it is to be understood that various other adaptations and modifications can be made within the spirit and scope of the invention. Therefore, it is the object of the append claims to cover all such variations and modifications as come within the true spirit and scope of the invention.

The invention claimed is:

1. A method for determining a location of a fault in an ungrounded power distribution system including a set of feeders connected to a substation, wherein each feeder includes a set of feeder sections, wherein each feeder section starts with an upstream switch and includes a set of loads connected by line segments and each line segment includes an upstream bus and a downstream bus, and the fault is a short-circuit fault including one or combination of a single-phase-to-ground fault, a phase-to-phase fault, a double-phase-to-ground fault, a three-phase-to-ground fault, and a phase-to-phase-to-phase fault, comprising:
    determining a type of the fault by comparing voltages and currents measured at a feeder breaker at a root of a feeder before and during the fault;
    determining, if the fault is the single-phase fault, a furthest feeder section of the feeder with an angle difference between a residual voltage and a residual current at the upstream switch close to 90 degrees as a faulty feeder section;

determining, if the fault is not the single-phase fault, a furthest feeder section of the feeder with an over-current at the upstream switch as the faulty feeder section;

determining an equivalent admittance matrix for boundaries of the faulty feeder section having the fault of the determined type at a candidate location; and selecting the candidate location as the location of the fault if the equivalent admittance matrix substantially satisfies the relationship of a current over a voltage measured at the boundaries of the faulty feeder section, wherein steps of the method are performed by a processor.

2. The method of claim 1, further comprising:
estimating the current using the equivalent admittance matrix and the measured voltage; and
selecting the candidate location as the location of the fault if a difference between the estimated current and the measured current is less than a threshold.

3. The method of claim 2, further comprising:
determining a set of equivalent admittance matrices of the faulty feeder section corresponding to different candidate locations of the fault at the faulty feeder section;
estimating a set of currents using the measured voltage and each equivalent admittance matrix from the set of equivalent admittance matrices;
determining differences between each estimated current and the measured current; and
selecting the candidate location of the fault corresponding the minimal difference as the location of the fault.

4. The method of claim 3, further comprising:
determining an initial set of equivalent admittance matrices of the faulty feeder section, each equivalent admittance matrix is determined for a candidate location of the fault at a different bus of the faulty feeder section;
determining differences between the measured current and each current estimated using each equivalent admittance matrix from the initial set to determine a bus corresponding to a minimal difference between the measured current and currents estimated using the initial set of equivalent admittance matrices; and
determining a faulty line segment as a segment adjacent to the bus, such that the set of equivalent admittance matrices is determined for the candidate locations on the faulty line segment.

5. The method of claim 4, further comprising:
estimating a current for each equivalent admittance matrix in the initial set of equivalent admittance matrices using the measured voltage to produce an initial set of estimated currents; and
determining a current mismatch using differences between the current measured at the boundaries of the faulty feeder section and each estimated current from the initial set.

6. The method of claim 2, further comprising
determining the difference is a Euclidean distance between the current measured at the boundaries of the faulty feeder section and the estimated current determined as a product of the voltages measured at the boundaries of the faulty feeder section and the equivalent admittance matrix of the faulty feeder section.

7. The method of claim 1, further comprising
determining the equivalent admittance matrix using a corresponding admittance matrix modeling relationship between injected currents and voltages for all measuring ports at the boundaries of the faulty feeder section.

8. The method of claim 7, wherein the faulty feeder section has one measuring port, further comprising:
determining the equivalent admittance matrix of the faulted feeder section by sequentially combining a one-port equivalent admittance matrices of each line segment determined starting from a last layer of the faulty feeder section.

9. The method of claim 7, wherein the faulty feeder section has two measuring ports, further comprising:
determining a lateral equivalent admittance matrix for each lateral connected to a mainline between the two measuring ports by sequentially combining a one-port equivalent admittance matrices of each line segment of the lateral determined starting from a last layer of the lateral; and
determining the equivalent admittance matrix of the faulted feeder section by sequentially combining two-ports equivalent admittance matrices of each line segment of the mainline determined starting from a downstream port of the faulty feeder section, wherein the two-ports equivalent admittance matrix of the line segment connected to the lateral includes the lateral equivalent admittance matrix.

10. The method of claim 7, wherein the faulty feeder section has more than two measuring ports, further comprising:
determining the equivalent admittance matrix of the faulty feeder section by applying Kron reduction to an admittance matrix for all buses of the faulty feeder section to remove all elements of the equivalent admittance matrix corresponding to buses with zero injected currents.

11. The method of claim 1, further comprising:
determining the equivalent admittance matrix using a load demand of the faulty feeder section determined based on pre-fault measurements.

12. The method of claim 11, further comprising:
determining a set of load scaling factors with minimal current mismatch at boundaries of the faulty feeder section using pre-fault voltage and current measurements; and
determining the load demand of the faulty feeder section using the set of load scaling factors and load profiles for individual loads.

13. The method of claim 1, further comprising:
determining the type of fault by checking over-voltage and over-current status of all phases at the feeder breaker during the fault.

14. The method of claim 1, further comprising:
determining the faulted feeder section by checking over-current status of all phases at switches along the feeder for a more than one phase fault, and angle differences of residual voltages and residual currents at switches along the feeder for a single phase fault.

15. A system for determining a location of a fault in an ungrounded power distribution system including a set of feeders connected to a substation, wherein each feeder includes a set of loads connected to line segments and each line segment includes an upstream bus and a downstream bus, and the fault is a short-circuit fault including one or combination of a single-phase-to-ground fault, a phase-to-phase fault, a double-phase-to-ground fault, a three-phase-to-ground fault, and a phase-to-phase-to-phase fault, comprising a processor for determining a faulty feeder section and a type of the fault based on voltages and currents measured before and after the fault; and selecting the location of the fault at the faulty feeder section by testing a relationship of a current over a voltage measured at boundaries of the faulty feeder section after the fault with different equivalent admittance matrices of the faulty feeder section determined for different candidate locations of the fault of the determined type.

* * * * *